United States Patent [19]

Jasinski

[11] 4,038,546

[45] July 26, 1977

[54] CLEANING APPARATUS FOR A CORONA GENERATING DEVICE

[75] Inventor: Stefan A. Jasinski, Webster, N.Y.

[73] Assignee: Xerox Corporation, Stamford, Conn.

[21] Appl. No.: 682,828

[22] Filed: May 3, 1976

[51] Int. Cl.[2] .................... H01J 37/26

[52] U.S. Cl. .................... 250/324; 361/229

[58] Field of Search .................... 250/324, 325, 326; 317/262 A

[56] References Cited

U.S. PATENT DOCUMENTS

| | | | |
|---|---|---|---|
| 3,842,273 | 10/1974 | Van Burskirk | 250/324 |
| 3,870,883 | 3/1975 | Oagley | 250/324 |
| 3,875,407 | 4/1975 | Hayne | 250/324 |
| 3,891,846 | 6/1975 | Ito | 250/324 |
| 3,965,400 | 6/1976 | Tolliver | 250/324 X |

*Primary Examiner*—Eli Lieberman
*Assistant Examiner*—T. N. Grigsby
*Attorney, Agent, or Firm*—Earl T. Reichert

[57] ABSTRACT

A corona generating device having an elongated generally U-shaped shield and a corona wire mounted within and extending along the length of the shield has an improved cleaning apparatus for cleaning both the interior surface of the shield and the wire. The cleaning apparatus includes a block slidably mounted within the shield so that the block can be moved back and forth along the shield, and a disposable cap which locks onto the block over the corona wire. The cap has cleaning pads mounted thereon for cleaning the interior surface of the shield, and a protrusion and recess are used to lock the cap onto the block in an operative position in which the cleaning pads contact the interior surface to be cleaned. Separate disposable pads for cleaning the corona wire are located between the block and cap, and when the cap is replaced, these wire cleaning pads are replaced also.

6 Claims, 3 Drawing Figures

CLEANING APPARATUS FOR A CORONA GENERATING DEVICE

BACKGROUND OF THE INVENTION

This invention relates to a corona generating device having an improved cleaning apparatus incorporated therein for cleaning the device.

In the practice of xerography as described in U.S. Pat. No. 2,297,691 to Chester F. Carlson, a xerographic surface comprising a layer of photoconductive insulating material affixed to a conductive backing is used to support electrostatic images. In the usual method of carrying out the process, the xerographic surfce is electrostatically charged uniformly over its surface, and then exposed to a light pattern of the image being reproduced to thereby discharge the charge in the areas where light strikes the layer. The undischarged areas of the layer thus form an electrostatic charge pattern or electrostatic latent image in conformity with the configuration of the original pattern.

The latent electrostatic image is developed by contacting it with a finely divided electrostatically attractable material, such as a resinous powder. The powder is held in the image areas by the electrostatic field on the layer. Where the field is greatest, the greatest amount of material is deposited, and where the field is least, little or no material is deposited. Thus, a powder image is produced in conformity with the image of the original being produced. The powder image is subsequently transferred to a sheet of paper or other transfer member, and suitably affixed thereto to form a permanent copy.

The latest concept for electrostatic reproduction machines utilizes high speed flash exposure of the document, and a moving photoconductive material in the form of an endless belt which is continuously charged. Additionally, such reproduction machines are provided with a developing system which supplies toner particles in relatively large quantities for solid area coverage, such as a magnetic brush developing apparatus. Thus, after the belt passes the magnetic brush assembly, for example, a xerographic powder image is formed on the belt which corresponds to the electrostatic latent image. This powder image is then transferred to a support surface (e.g., a sheet of paper) to which it is fused by a fusing assembly whereby the powder image is caused to adhere to the support surface permanently.

These electrostatic reproduction machines include corona generating devices to effect certain functions, including for example, charging the xerographic surface prior to exposure, treating the electrostatic latent image prior to development, treating the developed electrostatic image prior to transfer thereof, and charging the xerographic surface to neutralize the charge on the residual toner particles prior to contacting the surface with a cleaning brush.

One particularly useful type of corona generating device is described in detail in U.S. Pat. No. 2,836,725 issued to Vyverberg. This device is usually comprised of at least one corona wire which is partially surrounded by a conductive shield. Although this corona generating device is adapted to provide a uniform electrostatic charge on the desired surface, dust or toner particles accumulating on the corona wire and shield can cause non-uniform generation of corona current along the length of the corona wire.

A variety of techniques have been devised to reduce or remove such contamination. These techniques are disclosed in U.S. Pat. Nos. 3,324,291, 3,339,069, 3,382,360, 2,471,965, 3,483,372, 3,496,352, and 3,499,143. To clean the corona wire and/or the shield of a corona generating device, numerous arrangements are available. IBM Technical Disclosure Bulletin, Vol. 8, No. 8, January 1969, discloses a cleaning apparatus for cleaning the corona wire only. U.S. Pat. Nos. 3,842,273, 3,870,833, and 3,891,846 disclose apparatuses for simultaneously cleaning both the corona wire and the shield of a corona generating device.

The creation of corona current is predominantly determined by the potential difference between the corona wire and the shield. Dust particles and toner particles which accumulate on the inner walls of the shield produce deleterious effects, particularly for a grounded metal shield. These particles are comprised of dielectric material which can store charged ions generated by current through the corona wire. As the charge builds up on these particles, a non-uniform potential difference between the corona wire and the shield is produced with consequent variations in corona discharge along the length of the corona wire. This latter problem is particularly associated with corona generating devices employing a metallic shield. For corona generating devices employing a dielectric shield, e.g., a plastic material such as Teflon or Mylar, the accumultion of such particles on the shield has no appreciable effect on the current uniformity.

Although the cleaning apparatuses disclosed in the last three patents discussed above may be quite satisfactory for removing the contamination from both the interior of the shield and the corona wire, it is difficult for the technical representative to replace these cleaning apparatuses since this requires removal and/or partial disassembly of the corona generating device. Cleaning apparatuses for corona generating devices ultimately become dirty and have be be replaced. Thus, what is needed, is a cleaning apparatus for a corona generating device which is capable of cleaning all of the interior surfaces of the shield and the corona wire, a cleaning apparatus which includes disposable portions which can be quickly and easily replaced without having a disassemble the device itself.

SUMMARY OF THE INVENTION

A primary object of the present invention is to provide a cleaning apparatus for cleaning both the corona wire and the shield of a corona generating device, which cleaning apparatus includes disposble portions which can be easily and quickly replaced without having to remove or disassemble the device itself.

To effect this, the present invention includes a block which is slidably and permanently mounted with the corona shield, and a disposable cap which contains the cleaning pads for cleaning the interior surface(s) of the shiled. The cap can be easily locked into place on the sliding block, and when it is desired to replace the cap the operator merely grasps the cap and pulls outwardly which releases the cap from the sliding block. The pads for cleaning the corona wire are confined between the cap and the sliding block, and when the cap is removed these pads can be easily removed by the operator.

DETAILED DESCRIPTION OF THE INVENTION

Figure 1:
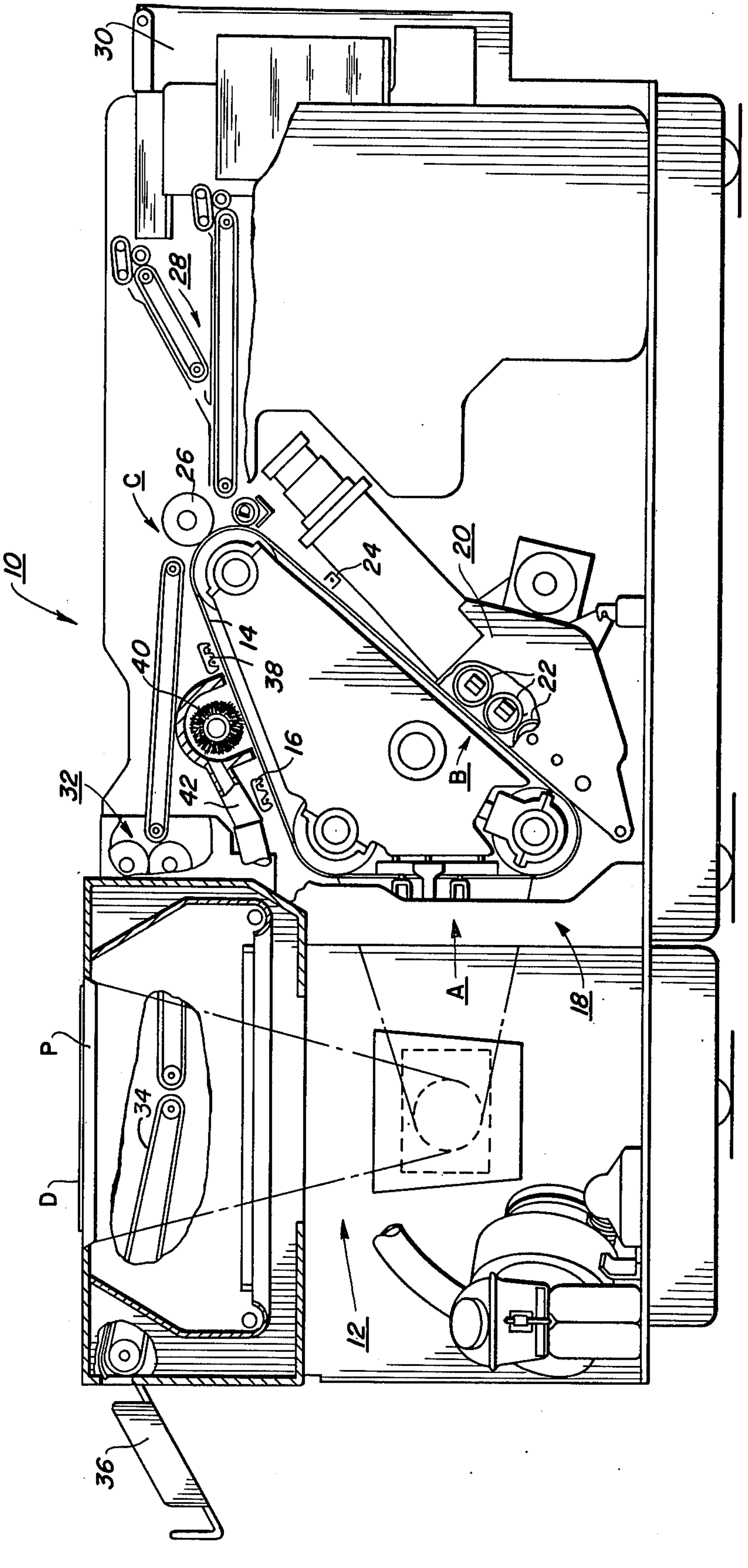
FIG. 1 is a schematic sectional view of an electrostatic reproduction machine embodying the principles of the invention.

For a general understanding of an electrostatic reproduction machine in which the invention may be incorporated, reference is made to FIG. 1 in which the various system components for the machine are schematically illustrated. As in all electrostatic systems of the type illustrated, a light image of a document to be reproduced is projected onto a charged xerographic surface to form an electrostatic latent image thereon. Thereafter, the latent image is developed with an oppositely charged developing material to form a xerographic powder image corresponding to the latent image on the xerographic surface. The powder image is then electrostatically transferred to a support surface to which it may be fused by a fusing device whereby the powder image is caused to adhere permanently to the support surface.

In the illustrated machine 10, an original document D to be copied is placed upon a transparent support platen P fixedly arranged in an illumination assembly indicated generally by the reference number 12, arranged at the left end of the machine; a platen cover (not shown) is then lowered onto the original D to cover the same. While upon the platen P, an illumination system flashes light rays upon the original thereby producing image rays corresponding to the informational areas of the original. The image rays are projected by means of an optical system for exposing the photosensitive surface of the xerographic plate or photoreceptor in the form of a flexible photoconductive belt 14. The surface of the belt was previously charged by a corona generating device 16. In order to effect image processing, the belt 14 is arranged on a belt assembly indicated generally by the reference numeral 18.

The photoconductive belt assembly 18 is slidably mounted upon two support shafts, one of which is secured to the frame of the machine, and is adapted to drive a belt 14 in the direction of the arrow at a constant rate. During this movement of the belt, the reflected light image of an original on the platen is flashed upon the surface of the belt to produce electrostatic latent images thereon at an exposure station A.

As the belt surface continues its movement, the electrostatic latent passes through a developing station B in which there is positioned a developer indicated generally by the reference numeral 20. This developer provides development of the electrostatic latent image by magnetic brushes 22.

The developed electrostatic image is then transported by the belt past a pre-transfer corona generating device 24 to a transfer station C where a sheet of copy paper is moved between a transfer roller 26 and the belt at a speed in synchronism with the moving belt in order to effect transfer of the developed image. There is provided at this station a sheet transport mechanism indicated generally by the numeral 28 which is adapted to transport sheets of paper from a paper handling mechanism indicated generally by the reference numeral 30 to the developed image on the belt at station C.

After the developed image is transferred to the sheet, the latter is stripped from the belt 14 and conveyed into a fuser assembly indicated generally by the reference numeral 32 where the developed and transferred xerographic powder image on the sheet is permanently affixed thereto. After each copy is thus produced, it is delivered via sheet transport mechanism 34 to an output tray 36.

After the image has been transferred at the transfer station C, the belt then moves past a corona generating device 38 where the residual background for the residual toner particles are loosened as a reuslt of an appropriate charge being placed on the residual toner by the corona generating device 38. The residual toner may then be more easily removed by a cleaner brush 40 after which the toner is removed by the vacuum duct 42. As stated above, there may be numerous corona generating devices in any given machine, and each of these devices needs to be periodically cleaned in order for the device to operate effectively. In the present machine, only three such corona generating devices are illustrated. It is understood, however, that numerous other corona generating devices may be used and the present invention is applicable to any such devices. It should also be understood that the present invention may be used in other types of electrostatic copying or duplicating machines, and is not limited to the high speed duplicating machine disclosed herein.

Figure 2:
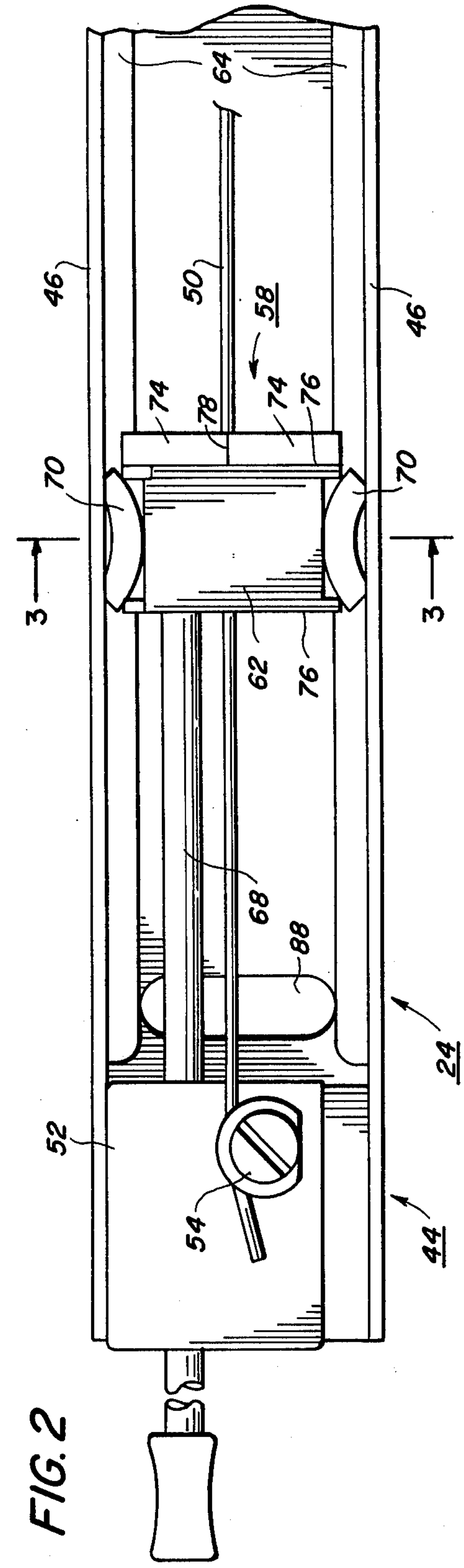
FIG. 2 is an enlarged transverse view of an embodiment of the present invention.
Figure 3:
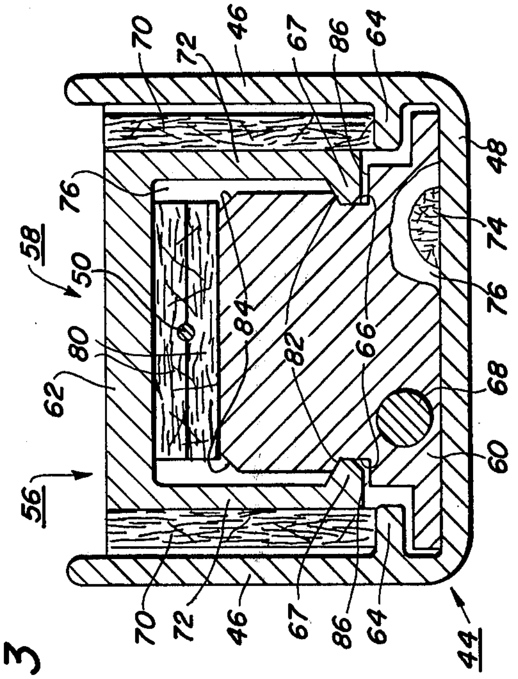
FIG. 3 is a cross-sectional view taken through line 3—3 of FIG. 2 with a portion of the block broken away to show the cap locked into its operative position on the block with all of the cleaning pads in contact with the surfaces to be cleaned.

Referring to FIGS. 2 and 3, the present invention will now be described in detail. As can be seen in these figures, the present invention is being discussed in relation to the pre-transfer corona generating device 24 which contains only a single corona wire. It is obvious, however, that the invention is equally applicale to either of the other two corona generating devices 16 and 38, or to corona generating devices which may be used for other purposes. The corona generating device 24 includes a generally U-shaped metallic shield 44 which includes two side walls 36 and a bottom wall 48. Although the two side walls 46 are shown as being generally perpendicular to the bottom wall 48 this is not necessary for the application of the present invention. Extending along elongated shield 44 is a corona wire 50, each end of the corona wire 50 being secured to an end block 52 by means of an adjusting screw 54. To deposit a charge onto the belt 14, a portion of the ions generated by current through the corona wire 50 pass through a discharge opening 56 and are deposited on the belt 12. As stated above, accumulations of dirt, toner, etc. on the corona wire 50, or on the interior surfaces of the shield 44 detrimentally affect this charging operation. To keep both the shield 44 and the corona wire 50 clean, an improved cleaning apparatus 58 is provided, which cleaning apparatus can be easily and conveniently replaced without having to remove the corona generating device 24 from the machine.

The cleaning apparatus 58 includes a cleaning block 60 and a cap 62. The block 60 is slidably retained within the shield 44 by means of ribs 64 which extend inwardly from the side walls 46 toward the center of the device 24. Thus, as can be seen the block 60 is permanently retained in the corona generating device 24 by means of the end blocks 52 and the ribs 64, the latter also serving to prevent the block from moving sufficiently to contact the corona wire 50. The block 60 has longitudinal recesses 66 formed in the sides of the block for locking the cap 62 onto the block by means of the protrusions 67 so that the cap is in its operative position shown in FIG. 3. An actuator rod 68 is provided to move the block 60 and cap 62 back and forth along the shield, the rod being connected to the block 60.

The cap 62 is made of a suitable resilient plastic and has four cleaning pads mounted thereon (e.g., by glue) for cleaning the interior surfaces of the shield. Two pads 70 are connected to the side walls 72 of the cap for cleaning the interior surfaces of the side walls 46 of the shield 44. Two additional pads 74 are mounted on one of the end walls 76 (e.g., by glue) for cleaning the interior surface of the bottom wall 48. All of the above cleaning pads are made of any suitable material, e.g., polyester felt. Although two pads 74 are used in order to provide a slit 78 for the corona wire 50, it is apparent that a single pad having a slit formed therein could be used instead. Each of the end walls also has a slot formed therein for the corona wire 50. Each of the slots is parallel to the side walls 72 and is wide enough so that neither of the end walls 76 contacts the corona wire 50 as the cleaning apparatus is moved back and forth along the device 24.

To clean the corona wire 50, two cleaning pads 80 are placed between the block 60 and cap 62, one pad on top of the corona wire 50, and one pad beneath it as viewed in FIG. 3. These pads are made of any suitable material, e.g., SCOTCH-BRITE Type "F" abrasive cloth, and are held in place by the cap 62, and are free to be manually removed when the cap 62 is removed from the block 60; these pads are not permanently secured to either the block 60 or the cap 62.

The procedure for replacing the cleaning pads 70, 74, and 80 will now be discussed. Referring to FIG. 3, it can be seen that by grasping the cap 62 and pulling upwardly, the protrusions 67 and resilient side walls 72 will be forced outwardly by the inclined surfaces 82 so that the cap can be moved upwardly over the block 60 and disposed of. After the cap 62 has been removed, the operator discards the disposable cap and manually removes the two pads 80 and inserts two new pads. A new cap is then pushed down over the block 60, the inclined surfaces 84 forcing the protrusions 67 and the resilient side walls 72 outwardly so that cap can be moved downwardly over the block until the protrusions reach the recesses to allow the side walls to snap inwardly to lock the cap into its operative position. It should also be noted that the surfaces 86 of the block 60 prevent the cap from being pushed downwardly far enough to contact the corona wire 50.

Thus, with the cap locked into its operative position where all of the cleaning pads 70, 74, and 80 are in contact with the surfaces which are to be cleaned, the operator merely grasps the rod 68 and moves the cleaning assembly back and forth along the device 24. Assuming the devices 24 is in the position shown in FIG. 3, contaminants will be ejected through the openings 88 formed in each end of the bottom wall 48 of the shield.

While the invention has been described with reference to the structure disclosed, it is not confined to the details set forth, but is intended to cover such modifications or changes as may come within the scope of the following claims.

What is claimed is:

1. An improved cleaning apparatus for a corona generating device of the type having an elongated generally U-shaped shield defining a discharge opening through which ions are emitted, and a corona wire mounted within and extending along the shield, wherein the improvement comprises:

a. a block, and means for slidably mounting and retaining the block within the shield so that the block can be moved back and forth along the shield;

b. a cap having shield cleaning means thereon for cleaning at least a portion of the interior surface of the shield; and c. means for locking the cap into an operative position as the cap is being pushed over the corona wire and block.

2. An improved cleaning apparatus as set forth in claim 1 wherein the cap is locked into its operative position, and further including wire cleaning means disposed between the block and the cap.

3. An improved cleaning apparatus as set forth in claim 2 and further including means for preventing the cap from contacting the corona wire in the event an attempt is made to move the cap beyond its operative position.

4. An improved cleaning apparatus as set forth in claim 1, wherein the locking means includes a protrusion and a recess.

5. An improved cleaning apparatus as set forth in claim 3, wherein the locking means includes a protrusion and a recess.

6. An improved cleaning apparatus as set forth in claim 5, and further including means for retaining the wire cleaning means between the block and the cap as the cleaning apparatus is moved back and forth along the corona generating device.

* * * * *